United States Patent
Chuang et al.

(10) Patent No.: US 9,790,609 B2
(45) Date of Patent: Oct. 17, 2017

(54) MANUFACTURING METHOD OF SUBSTRATE STRUCTURE, SUBSTRATE STRUCTURE AND METAL COMPONENT

(71) Applicant: Wistron NeWeb Corp., Hsinchu (TW)

(72) Inventors: Tzu-Wen Chuang, Hsinchu (TW);
Babak Radi, Hsinchu (TW);
Shih-Hong Chen, Hsinchu (TW);
Chun-Lin Chen, Hsinchu (TW)

(73) Assignee: Wistron NeWeb Corp., Hsinchu (TW)

( * ) Notice: Subject to any disclaimer, the term of this patent is extended or adjusted under 35 U.S.C. 154(b) by 1 day.

(21) Appl. No.: 14/719,329

(22) Filed: May 22, 2015

(65) Prior Publication Data
US 2016/0014907 A1    Jan. 14, 2016

(30) Foreign Application Priority Data
Jul. 14, 2014   (TW) .............................. 103124155 A

(51) Int. Cl.
*H05K 1/09*   (2006.01)
*C25D 5/34*   (2006.01)
*H05K 3/38*   (2006.01)

(52) U.S. Cl.
CPC .............. *C25D 5/34* (2013.01); *H05K 3/384* (2013.01); *H05K 3/387* (2013.01); *H05K 3/389* (2013.01)

(58) Field of Classification Search
CPC .......... C25D 5/34; H05K 3/384; H05K 3/387; H05K 3/389
USPC .................. 174/251, 250, 255–258
See application file for complete search history.

(56) References Cited

U.S. PATENT DOCUMENTS

| | | | |
|---|---|---|---|
| 8,158,238 B2* | 4/2012 | Miyashita | H01L 21/6831 361/234 |
| 2003/0146421 A1* | 8/2003 | Wakizaka | C08G 65/485 252/601 |
| 2005/0135065 A1* | 6/2005 | Nakatsu | H01L 23/4006 361/703 |
| 2010/0118390 A1* | 5/2010 | Blair | B82Y 20/00 359/346 |
| 2014/0183735 A1* | 7/2014 | Zhang | H01L 23/5384 257/741 |

FOREIGN PATENT DOCUMENTS

TW    201242449    10/2012

OTHER PUBLICATIONS

"Office Action of Taiwan Counterpart Application", dated Sep. 25, 2015, p. 1-p. 11, in which the listed reference was cited.

* cited by examiner

Primary Examiner — Tremesha S Willis
(74) Attorney, Agent, or Firm — Jianq Chyun IP Office

(57) ABSTRACT

A manufacturing method of a substrate structure including the following steps is provided. A chemical surface treatment is performed on a metal base such that a passivation layer is formed on a surface of the metal base. The metal base is assembled to a substrate. A metal pattern is formed on the substrate, wherein the metal pattern is separated from the metal base. A substrate structure and a metal component are also provided.

2 Claims, 3 Drawing Sheets

US 9,790,609 B2

MANUFACTURING METHOD OF SUBSTRATE STRUCTURE, SUBSTRATE STRUCTURE AND METAL COMPONENT

CROSS-REFERENCE TO RELATED APPLICATION

This application claims the priority benefit of Taiwan application serial no. 103124155, filed on Jul. 14, 2014. The entirety of the above-mentioned patent application is hereby incorporated by reference herein and made a part of this specification.

BACKGROUND OF THE INVENTION

Field of the Invention

The invention generally relates to a manufacturing method of substrate structure, a substrate structure, and a metal component, and in particular, to a manufacturing method of substrate structure, a substrate structure, and a metal component, wherein the substrate structure has passivation layers.

Description of Related Art

For the circuit board and the antenna application, the specific electroless plating is used to form the metal plating pattern on the plastic substrate. However, the plastic substrate itself is often associated with other metal components which are provided, such as, a metal nut or a metal insert and so on. These metal components have active metal surfaces, and therefore, in the case of producing metal pattern during electroless plating process, it may often happen that extra metal layers are adhered to the metal components, which causes an increased plating costs and a risk of short circuit. For example, in the case that extra metal layers attached on the thread surface of the metal nut, the metal layers plated on the metal nut through electroless plating may be squeezed and falling down when other members are assembled to the metal nut, which results in a short circuit. Further, when the metal pattern is also formed on a non-predetermined area, it may not only increase the amount of the plating bath but also result in a poor appearance problem.

Currently, some methods have been used to attempt to solve the above problem, for example, a positive charge is applied to the metal components through electrodes to exclude metal ions, and thereby preventing the occurrence of unwanted electroless plating. However, with an extra charge is applied, the plating bath becomes unstable and the risk of plating out is also increased. In addition, expensive fixtures are needed when the above-mentioned anti-plating method is performed. Therefore, people skilled in art are seeking for convenient and affordable anti-plating method.

SUMMARY OF THE INVENTION

The invention provides a metal component, a substrate structure, and a manufacturing method of substrate structure, wherein the passivation layer is formed on a surface of the metal substrate to achieve the function of the anti-plating.

An embodiment of the invention provides a manufacturing method of substrate structure which includes the following steps. A chemical surface treatment is performed on a metal base to form a passivation layer on a surface of the metal base. The metal base is assembled to a substrate. A metal pattern is formed on the substrate, wherein the metal pattern is separated from the metal base.

In an embodiment of the invention, the step of performing the chemical surface treatment on the metal base includes submerging the metal base in a solution of the thiol compound.

In an embodiment of the invention, the step of forming the metal patterns on the substrate comprises electroless plating.

An embodiment of the invention provides a substrate structure which includes a substrate, a metal pattern, a metal base, and a passivation layer. The metal pattern is disposed on the substrate. The metal base is disposed on the substrate. The passivation layer covers on a surface of the metal base, and the passivation layer is chemically bonded to the surface of the metal base.

In an embodiment of the invention, the passivation layer totally covers on the surface of the metal base.

In an embodiment of the invention, a portion of the metal base is buried within the substrate and the passivation layer is disposed between the metal base and the substrate.

In an embodiment of the invention, the metal base comprises a metal nut or a metal sheet.

In an embodiment of the invention, the material of the metal pattern comprises Cu, Ni, Au, or any combination of the above.

In an embodiment of the invention, the passivation layer is bonded to the surface of the metal base through alkylthiol, arylthiol, or aralkylthiol.

An embodiment of the invention provides a metal component which includes a metal base and a passivation layer. The passivation layer covers at least a portion of a surface of the metal base, and the passivation layer is chemically bonded to the surface of the metal base.

In an embodiment of the invention, the passivation layer totally covers on the surface of the metal base.

In an embodiment of the invention, the passivation layer is bonded to the surface of the metal base through alkylthiol, arylthiol, or aralkylthiol.

Based on the above, the embodiment of the invention provides a manufacturing method of substrate structure which may form a passivation layer on the surface of the metal substrate through a submerging method, so the production method is much simple. During the electroless plating, extra metal layer is not formed on the surface of the metal base owing to the passivation layer covering on the surface of the metal base, and the consumption of chemical plating solution is reduced while the problem of poor appearance which is caused by the extra metal layer is also solved.

In order to make the aforementioned and other features and advantages of the invention more comprehensible, several embodiments accompanied with figures are described in detail below.

DESCRIPTION OF THE EMBODIMENTS

Figure 1:
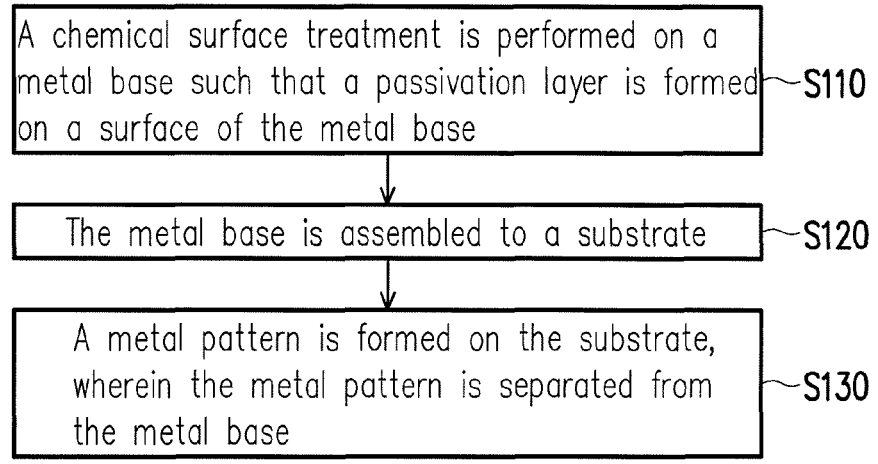
FIG. 1 is a flowchart illustrating manufacturing steps of the substrate structure according to an embodiment of the invention.
Figure 2:
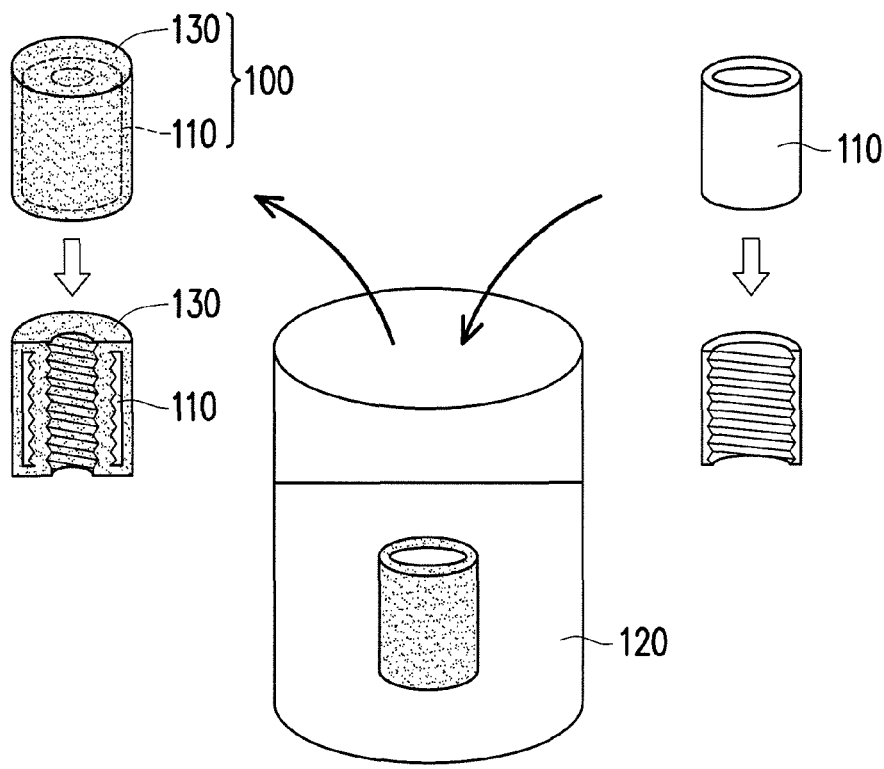
FIG. 2 to FIG. 6 are diagrams illustrating manufacturing steps of the substrate structure.

FIG. 1 is a flowchart illustrating manufacturing steps of the substrate structure according to an embodiment of the invention. FIG. 2 to FIG. 6 are diagrams illustrating manufacturing steps of the substrate structure. FIG. 4 is a cross-sectional schematic of FIG. 3. FIG. 6 is a cross-sectional schematic of FIG. 5. First, referring to FIG. 1 and FIG. 2, in step S110, a chemical surface treatment is performed on a metal base 110. The chemical surface treatment is, such as submerging the metal base to a solution of the thiol compound 120, so as to form a passivation layer 130 on the surface of the metal base 110, wherein the element showing under the metal base 110 at right side in FIG. 2 is a cross-section view of the metal base 110 while the element showing under the metal component 100 at left side in FIG. 2 is a cross-section view of the metal component 100.

The metal base 110 may be a metal insert disposed on the substrate (such as chassis, circuit board, etc.), and the metal inset may be a locking device or other devices having specific functions. For example, the metal base 110 may be a metal nut or a metal sheet, etc. Take the metal nut illustrated in FIG. 2 as an example, the metal nut has a screw thread which is suitable for the screw to be fixed here. However, the invention is not limited thereto. The material of the metal base 110 is, for example, brass or nickel.

The thiol compound solution 120 is formed by dissolving the thiol compound in the solvent, but the invention does not exclude that the thiol compound solution 120 further includes other components. In the present embodiment, the thiol compound having hydrophobic backbone is selected from a group consisted of octadecanethiol, nonanethiol, 1-hexadecanethiol, 1-butanethiol, tert-Nonyl mercaptan, benzyl mercaptan, and thiophenol. The solvent may be alcohol or other suitable solvents which are used to dissolve the above mentioned thiol compound.

For example, the metal base 110 may be submerged in the thiol compound solution 120 (such as 1-hexadecanethiol solution) for about 10 minutes, and the temperature of the solution is about 40° C. Then, the metal base 110 is washed out with water, and after drying for 20 minutes at 70° C., the passivation layer 130 covers on the surface of the metal base 110, so as to form a metal component 100. The metal component 100 includes the metal base 110 and the passivation layer 130 disposed on the surface of the metal base 110. The passivation layer 130 may totally cover the surface of the metal base 110, or only cover a portion of the surface of the metal base 110. The passivation layer 130 in the embodiment is formed on the metal base 110 through the submerging method, and therefore neither additional fixtures nor the use of the resin coated on the surface of the metal substrate 110 is required.

When the metal base 110 is submerging in the thiol compound solution 120, the thiol group reacts with the metal atom of the surface of the metal base 110 and then is bonded to the metal base 110 in the form of alkylthiol group, arylthiol group, or aralkylthiol group, in which the sulfur atoms may be chemically bonded to the metal atoms. That is, the passivation layer 130 is chemically bonded to the surface of the metal base 110. As a result, thiol compound may be formed on the surface of the metal base 110 as a fine passivation layer 130, and the passivation layer 130 is electrically insulating and has a hydrophobic nature. The passivation layer 130 has a higher chemical resistant and thermal resistant. The thickness of the passivation layer 130 is, such as 0.1 nm to 5 nm. In other embodiment, the thickness of the passivation 130 layer may be less than 1 nm. Due to the thickness of the passivation layer 130 is quite fine, when the metal base 110 is a metal nut, the size of the screw thread is not affected by the passivation layer 130 attached thereon, and therefore, the size mismatching between the screw and the nut is prevented in the subsequent assembling of the screw and the nut. Furthermore, there is no chance of short-circuit in the electronic device through the debris of passivation layer 130 due to being electrically insulating.

Figure 3:
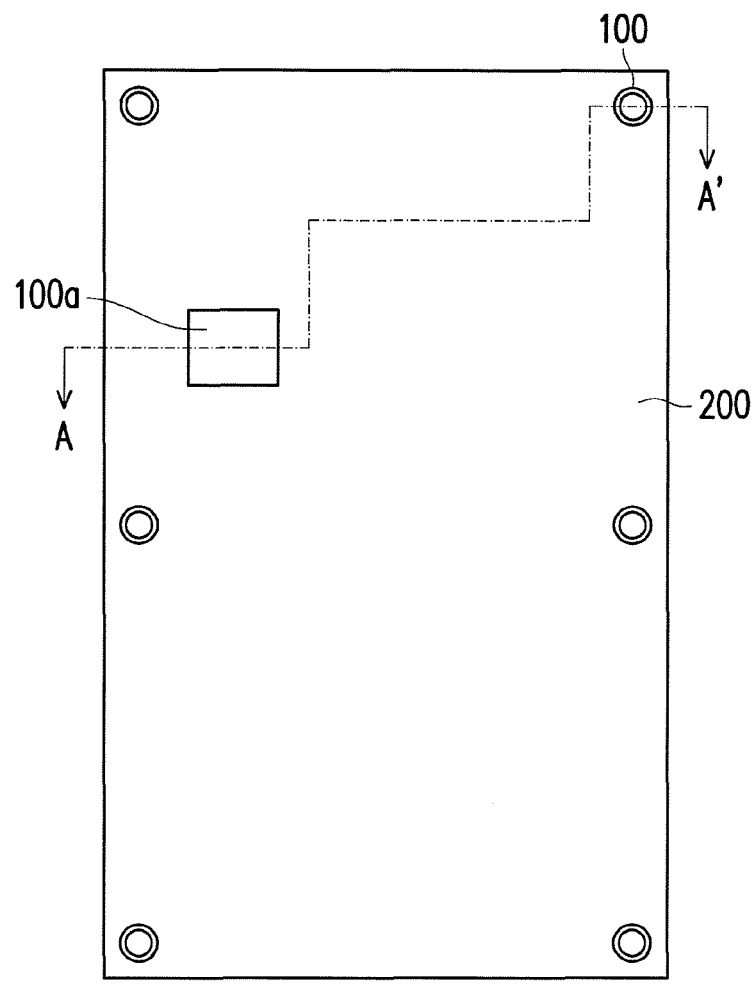
Figure 4:
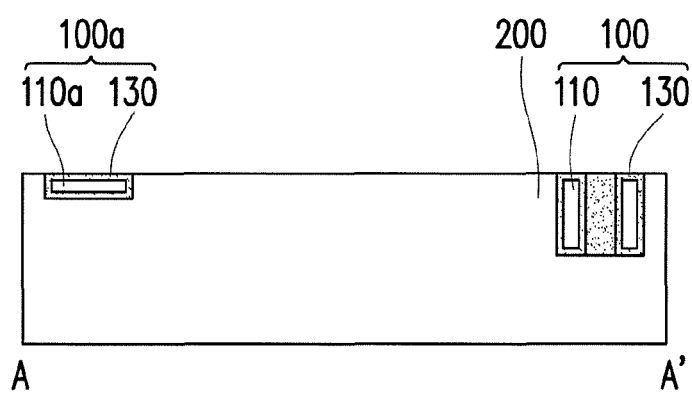

Referring to the FIG. 1, FIG. 3 and FIG. 4, in step S120, the metal component 100 (that is the metal base 110 with the passivation layer 130) is assembled to a substrate 200. The material of the substrate 200 is plastic, for example. A portion of the metal component 100 may be buried in the substrate 200 through a hot melting method or an insert mold method. Wherein, it may further reduce the possibility of deforming of the substrate 200 caused by the hot melting method and increase the binding of the metal member and the substrate. A portion of the surface of the metal components 100 is exposed by the substrate 200. The surface of the metal substrate 110 exposed by the substrate 200 is covered by the passivation layer 130. In the present embodiment, the passivation layer 130, for example, completely covers the surface of the metal base 110, and therefore the passivation layer 130 is located between the substrate 200 and the metal base 110, and such that the substrate 200 does not contact with the metal base 110. However, the invention is not limited thereto. In other embodiments, the passivation layer 130 only covers the surface of the metal base 110 exposed by the substrate 200, and thus the metal base 110 buried in the substrate 200, for example, contacts the substrate 200. In other words, in the previous step, the chemical surface treatment is performed only on the surface of the metal base 110 exposed by the substrate 200. As shown in FIG. 3 and FIG. 4, the metal component 100 may be a metal nut covered by the passivation layer 130, or a metal component 100a is configured on the substrate 200, for example, a metal sheet serves as the metal base 110a, and the surface of the metal base 110a is covered by the passivation layer 130.

Figure 5:
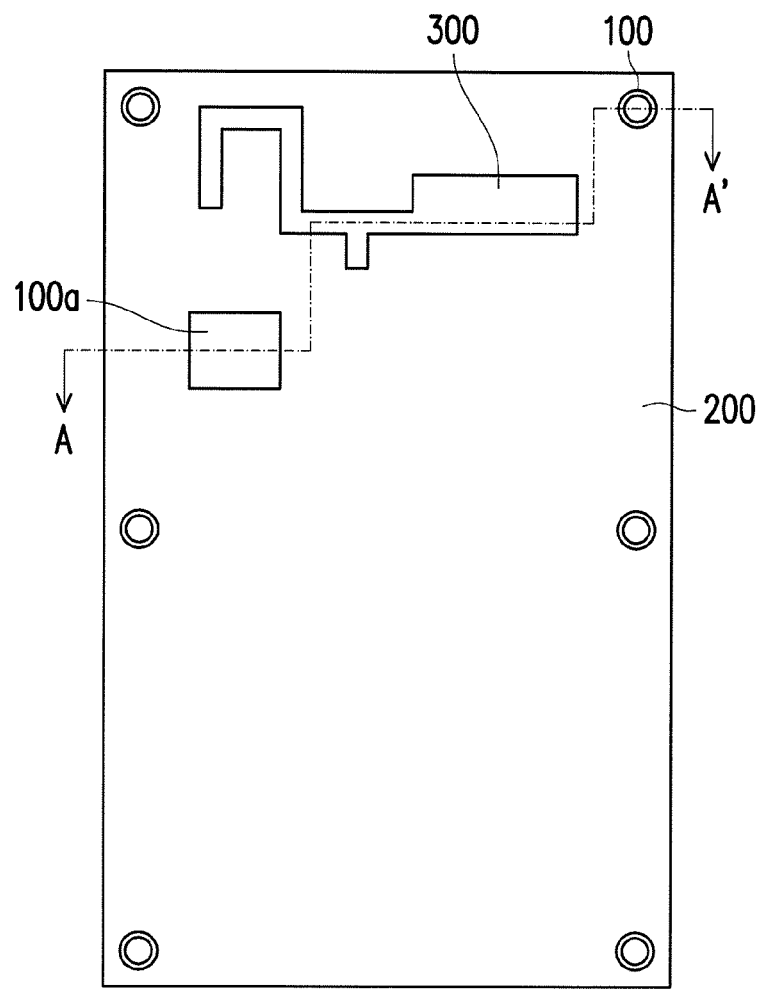
Figure 6:
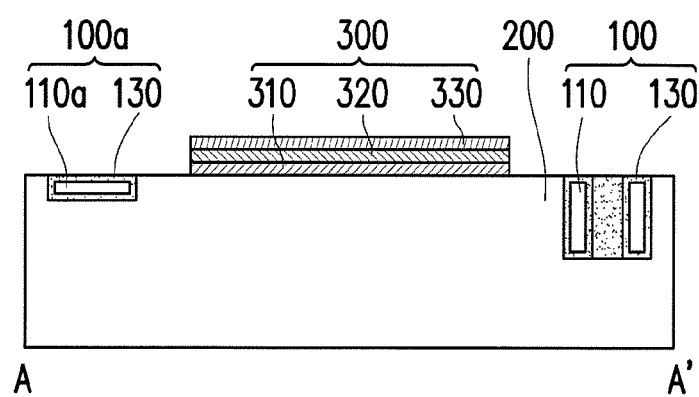

Then, referring to FIG. 5 and FIG. 6, in step S130, a metal pattern 300 is formed on the substrate 200, and the metal pattern 300 and the metal base 110 are separated from each other. The metal pattern 300 is, for example, antenna, pad or other electronic elements composed of metal layers. The material of the metal pattern 300 includes Cu, Ni, Au, Ag, or any combination of the above. The method of forming the metal pattern 300 includes electroless plating. In the present embodiment, the metal pattern may be formed on the substrate 200 through the electroless plating. The metal pattern 300 in the present embodiment is, such as antenna which includes multi-conductive layers. First, the copper layer 310 having a great conductivity is formed on the substrate 200. Then, the nickel layer 320 is formed on the copper layer 310, which has a great scratch resistance. Then, the gold layer 330 is formed on the nickel layer 320, which may reduce the oxidation of the nickel layer 320. However, the invention is not limited thereto. The metal pattern 300 may also include single conductive layer.

Specifically, the substrate 200 may be submerged in the chemical bath for forming a metal pattern 300 on the substrate 200 through the electroless plating. At this time, due to the passivation layer 130 is formed on the surface of the metal base 110, the metal pattern 300 may not formed on the passivation layer 130, so the metal pattern 300 may not be plated on the metal base 110 and so as to achieve the function of anti-plated. In other words, the metal pattern 300 may only be formed on the predetermined position, rather than on the metal base 110. As a result, it may reduce the consumption of chemical plating solution, may further save costs, and avoid the influence of appearance which is caused by the extra metal layer. Furthermore, the electroless plating process of the metal pattern 300 begins after the metal component 100 is assembled with the substrate 200 in the present embodiment. If the assembly process does not go well, because of the failed products have not been plated, the loss when the assembling is failed may be reduced and therefore the manufacturing costs is further reduced.

So far, it may almost complete the production of the substrate structure 10. Referring to FIG. 5 and FIG. 6, the substrate structure 10 includes a substrate 200, a metal pattern 300, a metal base 110, and a passivation layer 130. The metal pattern 300 is disposed on the substrate 200. The metal base 110 is disposed on the substrate 200. The passivation layer 130 covers on the surface of the metal base 110 and is chemically bonded to the surface of the metal base 110.

To sum up, the embodiment of the invention provides a manufacturing method of substrate structure which results in a passivation layer formed on the surface of the metal substrate through a submerging method without using additional fixtures nor coating resin on the surface of the metal substrate, so the production method is simple. When the electroless plating is performed to form the metal pattern, extra metal layer may not be formed on the surface of the metal base because of the passivation layer covering on the surface of the metal base, so the consumption of chemical plating solution is reduced, the plating costs is saved, and the influence of appearance resulted by the extra metal layer is avoided.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A manufacturing method of a substrate structure comprising:
submerging a metal nut in a thiol compound solution to perform a chemical surface treatment on the metal nut with thiol groups of the thiol compound solution to form a passivation layer chemically bonded to a surface of the metal nut, wherein the passivation layer having a thickness ranging from 0.1 nm to 5 nm completely encapsulates the metal nut;
physically screwing the metal nut that is encapsulated by the passivation layer into a substrate; and
forming a metal pattern on the substrate, wherein the metal pattern is separated from the metal nut and the passivation layer.

2. The manufacturing method according to claim 1, wherein the step of forming the metal pattern on the substrate comprises electroless plating.

* * * * *